United States Patent [19]

Yuhaku et al.

[11] Patent Number: 4,877,555
[45] Date of Patent: Oct. 31, 1989

[54] CONDUCTOR COMPOSITION AND METHOD OF MANUFACTURING A CERAMIC MULTILAYER STRUCTURE USING THE SAME

[75] Inventors: Satoru Yuhaku, Osaka; Seiichi Nakatani, Hirakata; Tutomu Nishimura, Uji, all of Japan

[73] Assignee: Matsushita Electric Industrial Co., Ltd., Osaka, Japan

[21] Appl. No.: 180,899

[22] Filed: Apr. 13, 1988

[30] Foreign Application Priority Data

Apr. 13, 1987 [JP] Japan .................. 62-90225
Apr. 13, 1987 [JP] Japan .................. 62-90227
Apr. 13, 1987 [JP] Japan .................. 62-90238

[51] Int. Cl.$^4$ ............................. H01B 1/06
[52] U.S. Cl. ..................... 252/512; 252/518; 106/1.13; 106/1.18; 106/1.23
[58] Field of Search ............ 252/512, 518; 106/1.05, 106/1.12, 1.13, 1.26, 1.18, 1.22, 1.23; 156/89

[56] References Cited

U.S. PATENT DOCUMENTS

| | | | |
|---|---|---|---|
| 4,172,919 | 10/1979 | Mitchell | 106/1.13 |
| 4,323,483 | 4/1982 | Rellick | 252/518 |
| 4,687,597 | 8/1987 | Siuta | 252/512 |
| 4,695,403 | 9/1987 | Nishimura et al. | 252/513 |
| 4,714,570 | 12/1987 | Nakatani et al. | 252/518 |

FOREIGN PATENT DOCUMENTS 26293 2/1986 Japan .

Primary Examiner—Josephine Barr
Attorney, Agent, or Firm—Wenderoth, Lind & Ponack

[57] ABSTRACT

Disclosed is a conductor paste effective to manufacture a ceramic multilayer structure. The conductor paste comprises an inorganic component containing CuO as a main component and at least one of Cu and $Cu_2O$. A multilayer body of the conductor paste and a dielectric paste is subjected to a binder removing process in air, a reduction process in a mixed gas of hydrogen and nitrogen, and a firing process in nitrogen, thereby to obtain a ceramic multilayer structure.

3 Claims, 3 Drawing Sheets

— 4,877,555 —

CONDUCTOR COMPOSITION AND METHOD OF MANUFACTURING A CERAMIC MULTILAYER STRUCTURE USING THE SAME

BACKGROUND OF THE INVENTION

1. Field of the Invention

The present invention relates to a conductor paste for producing internal conductor layers of a small-size, a light-weight ceramic multilayer structure such as a ceramic multilayer wiring substrate or a laminated ceramic capacitor, and a method of manufacturing the ceramic multilayer structure using the conductor paste.

2. Description of the Prior Art

Conventionally, for the conductor paste metal used for producing the internal conductor of the ceramic multilayer structure, noble metals, such as Pt, Pd, Au and Ag and alloys thereof, have widely been used. The noble metal paste can be fired in air, but has a disadvantage that it is expensive.

Recently, there has been developed a method of using base metal, such as Ni or Cu. Ni or Cu is not only inexpensive but also superior in migration, especially Cu is highly conductive. Such method of using the base metal is disclosed in, for example, U.S. Pat. Nos 4,172,919 and 4,323,483.

The method of using the base metal has a problem that the firing condition is complicated. The base metal like Cu will be oxidized unless fired in an inert atmosphere such as nitrogen atmosphere. On the other hand, since the multilayer material contains a large quantity of organic binder, oxygen is needed to decompose and remove the organic binder. Unless the binder is sufficiently removed, it remains as carbon, which adversely affects the dielectric property. Hence, an atmosphere compatible with both removal of organic binder and prevention of oxidation of metal must be kept during the firing. Considering the complicated control of atmosphere during the firing, this method is not suitable to mass-production.

We have developed a new method in which the base metal, such as Cu or Ni, is used in the form of oxide so that the organic binder is removable in air. This method comprises producing a multilayer of dielectric paste and conductor paste mainly composed of CuO or NiO, removing the organic binder, in air reducing the oxide in $N_2+H_2$ atmosphere, and firing the product in $N_2$ atmosphere. This method is disclosed in U.S. Pat. No. 4,714,570. A further improved CuO paste is disclosed in U.S. Pat. No. 4,695,403.

This method has facilitated atmospheric control during the firing, but has a point yet to be improved. Since base metal is used as oxide, shrinkage of volume of the internal conductor occurs during the reduction, thereby degrading the uniformity of the conductor layers. It is considered that the conductor layer may be made thick. But, this is not suitable to the case of a small-size, large capacitance laminated capacitor. In other words, it is required for increasing capacity per unit volume to reduce both the thickness of the conductor layer and the thickness of the dielectric layer.

SUMMARY OF THE INVENTION

An object of the invention is to provide a conductor paste effective for constituting with base metal an internal conductor of a ceramic multilayer structure, and a method of manufacturing a ceramic multilayer structure using the conductive paste.

In order to attain this object, a conductor paste of the invention comprises an inorganic component containing CuO as a main component and containing at least one of Cu and $Cu_2O$, and a vehicle. A ceramic multilayer structure is manufactured by a method comprising the steps of producing a multilayer structure of the conductor paste and a dielectric paste, removing an organic binder by heat treatment in air, metallizing the internal conductor in a reducing atmosphere, and firing the product in a neutral atmosphere.

With the above-mentioned conductor paste composition, it is possible to control expansion and shrinkage of volume of the internal conductor. In other words, Cu or $Cu_2O$ contained in the CuO conductor paste is oxidized in the oxidation atmosphere when the binder is removed, thereby causing some expansion. The oxidized constituent is reduced to Cu during the reducing step in the reducing atmosphere. In this case, the conductor layer is densified more than that using CuO alone, which was proved from the result of examination. Furthermore, since too high an amount of Cu or $Cu_2O$ would cause peeling of the conductor layer during the binder removing step, it is preferable that the Cu amount is at most 15 wt %, and the $Cu_2O$ amount is at most 25 wt %.

The present invention not only controls the expansion and shrinkage of the conductor layer to thereby obtain a densified conductor layer of low sheet resistance, but also incorporates the processes of removal of binder, reduction and firing as the aforesaid condition to thereby obtain a ceramic multilayer structure having a Cu base metal conductor layer. Also, the ceramic multilayer structure can fully provide high electrical conductivity, superior migration, and low cost, which are the advantages of Cu.

The above and further objects and novel features of the invention will be more fully apparent from the following description.

DETAILED DESCRIPTION OF THE INVENTION

EXAMPLE 1

Figure 1:
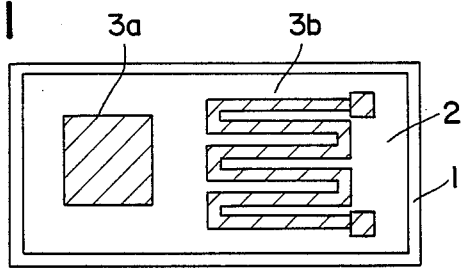
FIG. 1 is a top plan view of a ceramic multilayer substrate for measuring adhesion strength and sheet resistance.
Figure 2:
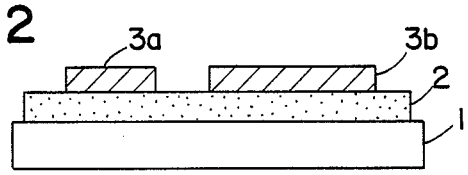
FIG. 2 is a side sectional view of the substrate shown in FIG. 1.

Conductor pastes were prepared by milling with a 3-stage roll mill inorganic components having compositions shown in Table 1 and an organic vehicle made by dissolving ethylcellulose by turpentine oil. An aluminum oxide powder was mixed with a borosilicate glass powder at a weight ratio of 1:1, and the mixed powder was milled with the same vehicle as that used in the conductor paste with a 3-stage roll mill to obtain a dielectric paste. By using the thus prepared conductor pastes and dielectric paste, test substrates as shown in FIGS. 1 and 2 were produced. FIG. 1 is a top plan view of each test substrate, and FIG. 2 is a side sectional view thereof. Each test substrate was produced by the following method.

On a main substrate 1 which was a sintered alumina substrate, the dielectric paste was printed by use of a screen of 200 mesh, and dried at a temperature of 120° C. for ten minutes to obtain a dielectric layer 2. On the dielectric layer 2, the conductor paste was printed by use of a screen of 400 mesh and dried to obtain a pattern 3a for measuring adhesion strength and a pattern 3b for measuring sheet resistance. Thus, a not-sintered test substrate was produced.

Next, binder removal from the not-sintered test substrate was carried out. Organic binder used in the dielectric paste and conductor paste was ethylcellulose as described before. Accordingly, to carry out decomposition and removal of the binder by heat treatment in air, a temperature of about 400° C. or more is required. Hence, in this Example, the binder removal was carried out at a temperature of 500° C. In addition, although the temperature for removing the binder may be equal to or more than the decomposing temperature of the binder, the heat treatment may preferably be carried out at a temperature of at highest 600° C. so as to avoid unnecessary diffusion of the conductor paste material into the dielectric layer. The temperature of removing the binder was decided previously on the basis of the result of thermal analysis of the binder. The amount of remaining carbon after the binder removing process was analyzed so as to confirm sufficient binder removal. As a result of observing the test substrates after the binder removal, it was found that when the content of Cu or $Cu_2O$ in the conductor paste is too large, peeling of the conductor paste layer occurs.

Next, in the reduction process, the binder-removed substrate was inserted into a tubular furnace using an alumina core tube of 120 mmφ, and flows of nitrogen gas of 1.0 l/min and hydrogen gas of 0.5 l/min were introduced in the furnace at a temperature of 400° C. When the reduction temperature is low, the conductor paste material is not reduced to metal Cu, and conversely when high, lead component of the glass in the dielectric layer is reduced. Therefore, an optimum reduction temperature is in a range of 350° to 450° C.

Next, the firing process was carried out by use of the same tubular furnace as that used in the reduction process in an atmosphere of pure nitrogen at a temperature of 900° C.

The test substrates produced as abovementioned were evaluated. The result thereof is shown in Table 1.

TABLE 1

| Sample No. | Inorganic Component | | | Sheet Resistance (mΩ/□) | Adhesion Strength (kg/mm²) |
|---|---|---|---|---|---|
| | CuO (wt %) | Cu (wt %) | $Cu_2O$ (wt %) | | |
| 1 | 100 | 0 | 0 | 3.0 | 1.3 |
| 2 | 98 | 2 | 0 | 3.0 | 1.5 |
| 3 | 95 | 2 | 3 | 2.8 | 2.0 |
| 4 | 95 | 0 | 5 | 2.8 | 2.0 |
| 5 | 95 | 5 | 0 | 2.5 | 2.1 |
| 6 | 90 | 0 | 10 | 2.4 | 2.1 |
| 7 | 90 | 10 | 0 | 2.2 | 2.3 |
| 8 | 85 | 5 | 10 | 2.4 | 2.3 |
| 9 | 85 | 15 | 0 | 2.0 | 2.2 |
| 10 | 80 | 5 | 15 | 2.0 | 2.2 |
| 11 | 75 | 0 | 25 | 2.1 | 2.1 |

TABLE 1-continued

| Sample No. | Inorganic Component | | | Sheet Resistance (mΩ/□) | Adhesion Strength (kg/mm²) |
|---|---|---|---|---|---|
| | CuO (wt %) | Cu (wt %) | $Cu_2O$ (wt %) | | |
| 12 | 75 | 10 | 15 | Conductor paste layer was peeled. | |
| 13 | 70 | 0 | 30 | Consuctor paste layer was peeled. | |

As seen from Table 1, addition of Cu or $Cu_2O$ or mixture thereof improves the sheet resistance and adhesion strength. This is because the addition of Cu and/or $Cu_2O$ densifies the conductor layer. When too much Cu or $Cu_2O$ is added too much, peeling of the conductor paste layer occurs during the binder removal step, and conversely, when too little is added, the above effect is reduced. Hence, it is seen that an optimum quantity of Cu or $Cu_2O$ is 5 to 15 wt. % when only Cu is added, 5 to 25 wt. % when only $Cu_2O$ is added, and 2 to 10 wt. % of Cu and 3 to 15 wt. % of $Cu_2O$ when both of Cu and $Cu_2O$ are added.

EXAMPLE 2

Figure 3:
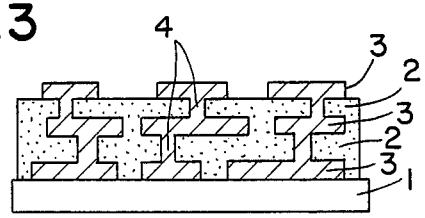
FIG. 3 is a sectional view of a ceramic multilayer substrate of two-layer conductive structure.

Next, ceramic multilayer wiring substrates as shown in FIG. 3 were produced to examine the addition effect of Cu and/or $Cu_2O$. In FIG. 3, conductor layers 3 and dielectric layers 2 are alternately laminated on an alumina substrate 1. The conductor layers are connected through via holes 4.

Conductor pastes were prepared by milling inorganic components of compositions shown in Table 2 with a vehicle made by dissolving ethylcellulose in terpineol. On the sintered alumina substrate the conductor paste was printed and dried to form a wiring pattern of 200 μm in line width and 10 μm in film thickness as a first conductor paste layer. On the first conductor paste layer the same dielectric paste as in Example 1 was printed and dried to form a first dielectric layer with via holes. On the first dielectric layer the conductor paste was printed and dried to form another pattern as a second conductor paste layer. Similarly, the conductor paste and dielectric paste were alternately printed and dried to produce a non-sintered substrate having three conductor paste layers.

Next, the not-sintered substrate was subjected to the binder removal process at 500° C. in air, the reduction process at 400° C. in a mixed gas of hydrogen and nitrogen, and the firing process at 900° C. in nitrogen, thereby producing the ceramic multilayer wiring substrate as shown in FIG. 3.

The multilayer substrate was cut to observe the interior thereof. The result was that no crack or delamination were found, each conductor layer was densified, and connections at the via holes were reliably achieved. Thus, the addition effect of Cu or $Cu_2O$ was proved. Furthermore, moisture resistance and migration were sufficient for practical use.

TABLE 2

| Sample No. | CuO wt % | Cu wt % | $Cu_2O$ wt % |
|---|---|---|---|
| 1 | 90 | 10 | 0 |
| 2 | 85 | 0 | 15 |
| 3 | 85 | 5 | 10 |

In Examples 1 and 2, the sintered alumina substrate is used as the base of the substrate. But, another ceramic sintered material such as SiC, BeO, AlN or $MgAl_2O_4$ may be used. Also, the base may be a green sheet (row sheet) of ceramic or glass or mixture of them, having the same composition as the dielectric paste. Further, the dielectric paste is not limited to the mixture of alumina and borosilicate lead glass, but may be other ceramics or glasses which can be sintered under the melting point of Cu.

EXAMPLE 3

Figure 4:
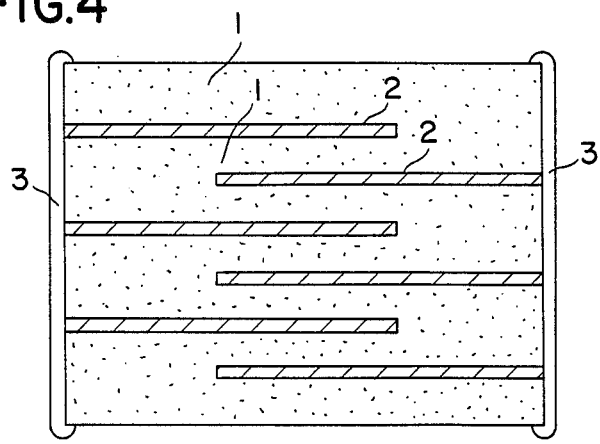
FIG. 4 is a sectional view of a laminated ceramic capacitor.

Next, a laminated ceramic capacitor having a structure as shown in FIG. 4 was produced. In FIG. 4, reference numeral 1 designates dielectric layers, 2 designates conductor layers, and 3 designates external electrodes. Dielectric material used was a dielectric material (Y5U 153U made by TAM Ceramic Co.) having a Pb (Mg 1/3, Nb 2/3) $O_3$-based lead perovskite structure. The average particle size was about 1.5 $\mu$m. This dielectric material as an inorganic component, butyral resin as an organic binder, di-n-butyl-phthalate as a plasticiser, and toluene as a solvent, were mixed in amounts as shown in Table 3 to obtain a slurry. The slurry is filmed on an organic film by the doctor-blade method and dried to produce a green sheet, which was about 30 $\mu$m in thickness after being dried.

TABLE 3

| Inorganic Component | 100 parts |
| --- | --- |
| Butyral resin | 25 parts |
| Di-n-butyl phthalate | 5 parts |
| Toluene | 40 parts |

Next, an inorganic component which was a mixture of 85 wt. % of CuO powder, 5 wt. % of Cu powder and 10 wt. % of $Cu_2O$ powder was milled with a vehicle made by dissolving ethylcellulose in terpineol in a three-stage roll mill to a moderate viscosity of conductor paste.

The conductor paste was screen-printed on the green sheet to form an electrode pattern. The similarly produced green sheets were laminated in a desired number so as to constitute opposite electrodes, and pressed by a heat press under a temperature of 80° C. and a pressure of 120 kg/cm². The thus obtained laminated body as cut in a predetermined size.

Figure 6:
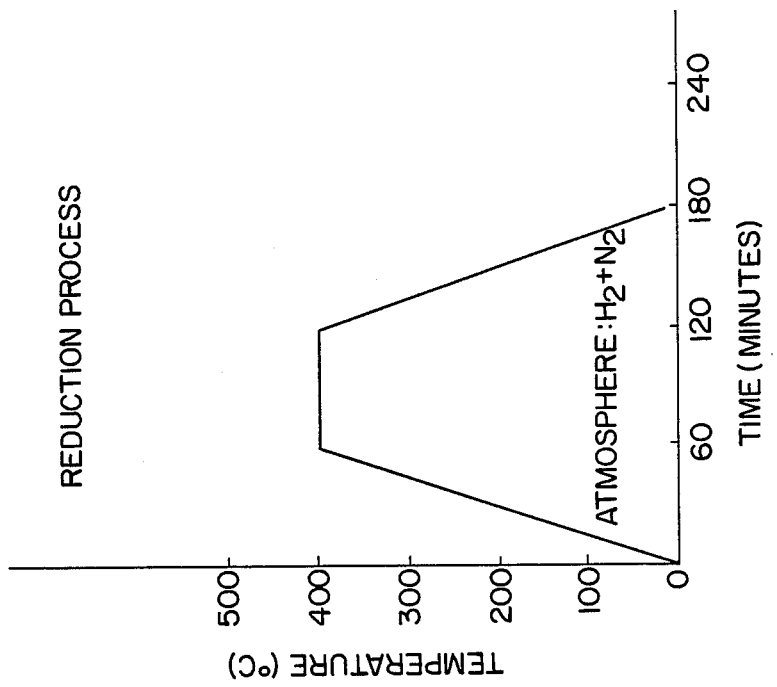
FIGS. 5, 6 and 7 are graphs exemplary of the temperature profiles of the binder removal process, reduction process and firing process of the manufacturing method of the invention.
Figure 5:
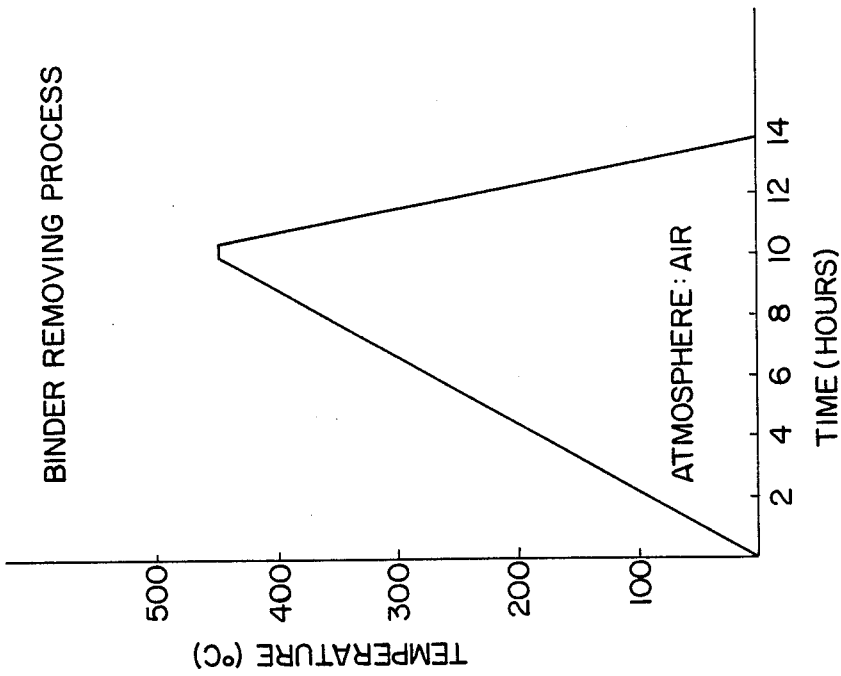
Figure 7:
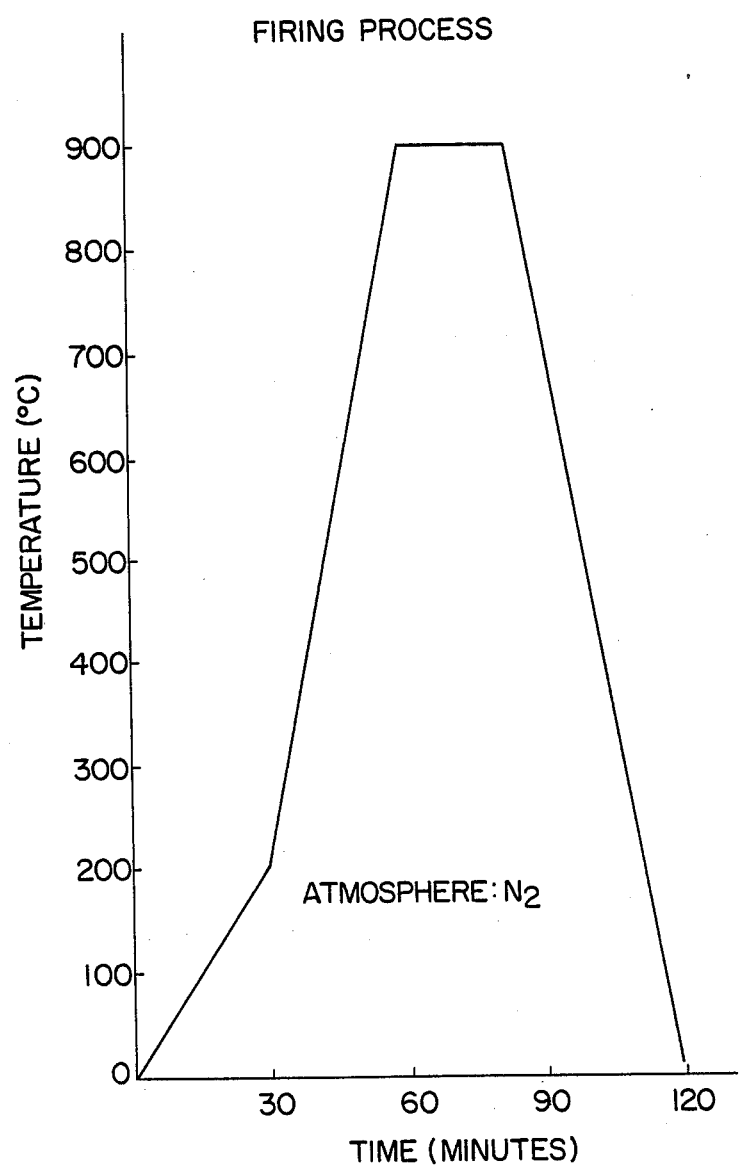

Next, the binder removal, reduction and firing for the laminated member were carried out by the same method as in Example 1 to obtain a laminated ceramic capacitor. The temperature profiles of the processes are shown in FIGS. 6, 7 and 8. The binder removal was carried out at a temperature of 450° C. in air, the reduction at 400° C. in a mixed gas of hydrogen and nitrogen, and the firing at 900° C. in nitrogen.

The external electrodes were produced by coating opposite surfaces of the capacitor with a metallic copper paste, which was then dried and fired at 600° C. in nitrogen atmosphere.

The capacitor showed a dielectric constant of about 7000, an insulation resistance of $1.8 \times 10^{12}$ $\Omega$·cm, and tan $\delta$ of 1.5%, which are sufficient for practical use. No crack or delamination was found in observation of the internally cut surface. Furthermore, the moisture resistance and migration were sufficient for practical use.

What is claimed is:

1. A conductor composition comprising an inorganic component and a vehicle, wherein said inorganic component comprises 85 to 95 wt. % of CuO and 15 to 5 wt. % of Cu.

2. A conductor composition comprising an inorganic component and a vehicle, wherein said inorganic component comprises 75 to 95 wt. % of CuO and 25 to 5 wt. % of $Cu_2O$.

3. A conductor composition comprising an inorganic component and a vehicle, wherein said inorganic component comprises 80 to 95 wt. % of CuO, 2 to 10 wt. % of Cu, and 3 to 15 wt. % of $Cu_2O$.

* * * * *